(12) United States Patent
Xu et al.

(10) Patent No.: US 11,809,051 B2
(45) Date of Patent: Nov. 7, 2023

(54) DISPLAY PANEL AND DISPLAY DEVICE

(71) Applicants: Fuzhou BOE Optoelectronics Technology Co., Ltd., Fuzhou (CN); BOE Technology Group Co., Ltd., Beijing (CN)

(72) Inventors: Xu Xu, Beijing (CN); Wenchao Wang, Beijing (CN); Sang Jin Park, Beijing (CN); Baoqiang Wang, Beijing (CN); Honglin Zhang, Beijing (CN); Xiangnan Yun, Beijing (CN)

(73) Assignees: FUZHOU BOE OPTOELECTRONICS TECHNOLOGY CO., LTD., Fuzhou (CN); BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 17/354,759

(22) Filed: Jun. 22, 2021

(65) Prior Publication Data
US 2022/0155632 A1    May 19, 2022

(30) Foreign Application Priority Data
Nov. 19, 2020   (CN) .......................... 202011300161.4

(51) Int. Cl.
*G02F 1/1362*    (2006.01)
(52) U.S. Cl.
CPC ................ *G02F 1/13629* (2021.01)

(58) Field of Classification Search
CPC ......... G02F 1/134372; G02F 1/136286; G02F 1/13629; G02F 1/134318
See application file for complete search history.

(56) References Cited

U.S. PATENT DOCUMENTS

| 2006/0176434 | A1* | 8/2006 | Kim ..................... G02F 1/1393 345/30 |
| 2010/0007837 | A1* | 1/2010 | Ham .................. G02F 1/134309 349/139 |
| 2017/0285428 | A1* | 10/2017 | Seong .................... H01L 27/124 |

FOREIGN PATENT DOCUMENTS

| CN | 110058422 A | * | 7/2019 |
| KR | 20160042352 A | * | 4/2016 |

* cited by examiner

*Primary Examiner* — Alexander P Gross
(74) *Attorney, Agent, or Firm* — Workman Nydegger

(57) ABSTRACT

The present disclosure discloses a display panel and a display device. The display panel includes a base substrate, and the base substrate includes a plurality of sub-pixels and a plurality of signal routing wires; where each of the plurality of sub-pixels includes an effective light-emitting region; an orthographic projection of the effective light-emitting region on the base substrate and an orthographic projection of one of the plurality of signal routing wires on the base substrate have a first overlapping region; and the first overlapping region is in a non-linear shape.

14 Claims, 17 Drawing Sheets

DISPLAY PANEL AND DISPLAY DEVICE

CROSS-REFERENCE TO RELATED APPLICATIONS

The present application claims the priority of the Chinese patent application No. 202011300161.4, filed to the China Patent Office on Nov. 19, 2020, of which the entire contents are incorporated herein by reference.

FIELD

The present disclosure relates to the technical field of display, in particular to a display panel and a display device.

BACKGROUND

In recent years, the 3D display field has developed rapidly. Among them, a grating-type 3D display device has attracted much attention due to its advantages such as simple manufacturing process and low crosstalk. Generally, the grating-type 3D display device includes a display panel and a grating, and a viewer obtain a left-eye view and a right-eye view displayed on the display panel with the left eye and right eye respectively through the grating to form a 3D display image.

SUMMARY

Embodiments of the present disclosure provide a display panel and a display device, and the display panel includes: a base substrate; where the base substrate includes a plurality of sub-pixels and a plurality of signal routing wires; each of the sub-pixels include an effective light-emitting region;

an orthographic projection of the effective light-emitting region on the base substrate and an orthographic projection of one of the signal routing wires on the base substrate have a first overlapping region; and the first overlapping region is in a non-linear shape.

In some embodiments, the first overlapping region is in a broken line shape, and a bending angle of the first overlapping region is greater than or equal to 70° and less than 180°.

In some embodiments, the plurality of signal routing wires include a plurality of data lines; one column of sub-pixels corresponds to one data line;

each data line includes a first sub-data line and a second sub-data line electrically connected with each other;

an orthographic projection of each first sub-data line on the base substrate and the orthographic projection of the effective light-emitting region of a corresponding sub-pixel on the base substrate form the first overlapping region; and orthographic projections of second sub-data lines on the base substrate do not overlap the orthographic projections of the effective light-emitting regions on the base substrate.

In some embodiments, the display panel further includes: a first insulating layer located between the data lines and the base substrate, and a plurality of auxiliary lines located between the first insulating layer and the base substrate; where the auxiliary lines extend in a column direction of the sub-pixels; one sub-pixel corresponds to one auxiliary line;

orthographic projections of the auxiliary lines on the base substrate do not overlap the orthographic projections of the effective light-emitting regions on the base substrate; and for the same sub-pixel, an orthographic projection of an auxiliary line on the base substrate and the orthographic projection of the first sub-data line on the base substrate form a triangle; and the bending angle is an included angle of a side, facing the auxiliary line, of the first overlapping region.

In some embodiments, the display panel further includes: a second insulating layer located on a side, facing away from the base substrate, of the data lines; and a transparent pixel electrode layer located on a side, facing away from the base substrate, of the second insulating layer;

where the transparent pixel electrode layer includes a plurality of pixel electrodes spaced apart from one another, and one sub-pixel includes one pixel electrode.

In some embodiments, each pixel electrode includes: a first sub-pixel electrode, a second sub-pixel electrode, and an electrode connection part; where the first sub-pixel electrode and the second sub-pixel electrode are spaced apart from each other, and the first sub-pixel electrode and the second sub-pixel electrode in the same pixel electrode are electrically connected through the electrode connection part; and orthographic projections of the data lines on the base substrate do not overlap orthographic projections of first sub-pixel electrodes and second sub-pixel electrodes on the base substrate.

In some embodiments, the display panel further includes: a common electrode layer and a third insulating layer; where the common electrode layer is located between the second insulating layer and the transparent pixel electrode layer, and the third insulating layer is located between the common electrode layer and the transparent pixel electrode layer; or the common electrode layer is located between a layer where the auxiliary lines are located and the base substrate, and the third insulating layer is located between the common electrode layer and the layer where the auxiliary lines are located.

In some embodiments, the plurality of data lines include a plurality of first-type data lines and a plurality of second-type data lines; where the first-type data lines and the second-type data lines are alternately disposed in a row direction of the sub-pixels; and every two adjacent columns of sub-pixels serve as a column group, every two adjacent column groups correspond to one first-type data line, odd-numbered rows of sub-pixels of a first column group in the every two adjacent column groups are all electrically connected with a corresponding first-type data line, and even-numbered rows of sub-pixels in a second column group in the every two adjacent column groups are all electrically connected with a corresponding first-type data line.

In some embodiments, the common electrode layer includes a plurality of common electrode parts spaced apart from one another; where orthographic projections of the common electrode parts on the base substrate do not overlap orthographic projections of the first-type data lines on the base substrate; and/or, the orthographic projections of the common electrode parts on the base substrate do not overlap orthographic projections of scan lines on the base substrate; and/or, the orthographic projections of the common electrode parts on the base substrate overlap orthographic projections of the second-type data lines on the base substrate.

In some embodiments, one column group corresponds to one second-type data line, and one second-type data line corresponds to one column of common electrode parts; and when the common electrode layer is located between the second insulating layer and the transparent pixel electrode layer, the second-type data lines are electrically connected with the corresponding common electrode parts through second vias penetrating the second insulating layer.

In some embodiments, the display panel further includes common electrode connection lines disposed in the same layer as the scan lines and spaced apart from one another; where the common electrode connection lines extend in the row direction of the sub-pixels, and orthographic projections of the common electrode connection lines on the base substrate do not overlap the orthographic projections of the effective light-emitting regions on the base substrate; and the common electrode connection lines are electrically connected with the second-type data lines through first vias penetrating the first insulating layer.

In some embodiments, one column group corresponds to one second-type data line, and the one second-type data line corresponds to one column of common electrode parts; and when the common electrode layer is located between the layer where the auxiliary lines are located and the base substrate, the second-type data lines are electrically connected with the corresponding common electrode parts through third vias penetrating the first insulating layer and the third insulating layer.

In some embodiments, the display panel further includes common electrode connection lines in the same layer as the scan lines and spaced apart from one another; where the common electrode connection lines extend in the row direction of the sub-pixels, and orthographic projections of the common electrode connection lines on the base substrate do not overlap the orthographic projections of the effective light-emitting regions on the base substrate;

the third vias include third transfer holes and third conducting holes, where the third transfer holes penetrate the first insulating layer, and the third conducting holes penetrate the third insulating layer; and the second-type data lines are electrically connected with the common electrode connection lines through the third transfer holes, and the common electrode connection lines are electrically connected with the common electrode parts through the third conducting holes.

An embodiment of the present disclosure provides a display device, including the above display panel.

In some embodiments, the display device further includes a grating located on a light emitting side of the display panel.

DETAILED DESCRIPTION OF THE EMBODIMENTS

Figure 1:
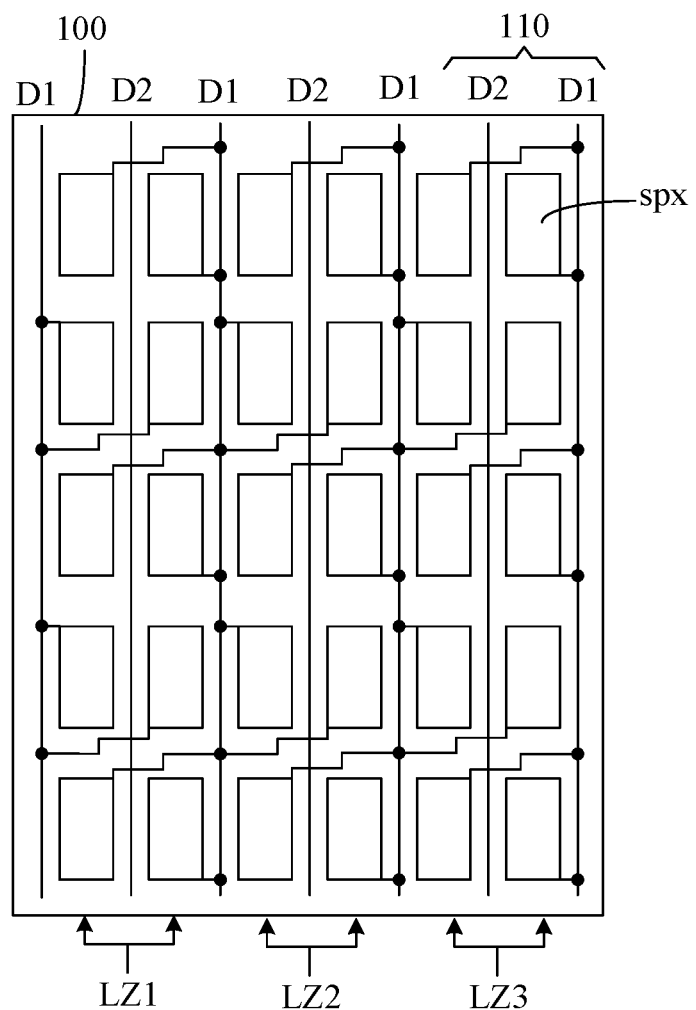
FIG. 1 is a brief schematic structural diagram of a display panel in an embodiment of the present disclosure.

In order to make the objectives, technical solutions, and advantages of the embodiments of the present disclosure clearer, the technical solutions in embodiments of the present disclosure will be clearly and fully described in combination with the accompanying drawings of the embodiments of the present disclosure. It is apparent that the described embodiments are some, but not all, embodiments of the present disclosure. Also, embodiments and features in the embodiments of the disclosure may be combined with one another without conflict. Based on the described embodiments of the present disclosure, all other embodiments attainable by one of ordinary skilled in the art without involving any inventive effort are within the scope of the present disclosure.

Unless otherwise defined, the technical terms or scientific terms used in the present disclosure shall have the usual meanings understood by those with ordinary skills in the field to which the present disclosure belongs. "First", "second" and similar words used in the present disclosure do not indicate any order, quantity or importance, but are only used to distinguish different components. "Comprise" or "include" or other similar words mean that the element or item appearing before the word covers elements or items listed after the word and their equivalents, but does not exclude other elements or items. "Connecting" or "connected" or other similar words are not limited to physical or mechanical connections, but may include electrical connections, whether direct or indirect.

It should be noted that the dimensions and shapes of the various figures in the drawings are not to scale and are intended to be merely illustrative of the present disclosure. The same or similar reference numerals refer to the same or similar elements or elements having the same or similar functions throughout.

When a grating-type 3D display device is in use, due to the process of a display panel or other factors, a formed 3D display image may produce moire, which affects the 3D display effect.

An embodiment of the present disclosure provides a display panel. As shown in FIGS. 1 to 7B, the display panel may include: a base substrate 100. The base substrate 100 includes a plurality of sub-pixels spx and a plurality of signal routing wires 110. Each sub-pixel spx includes an effective light-emitting region FG. Orthographic projections of the effective light-emitting regions FG on the base substrate 100 and orthographic projections of the signal routing wires 110 on the base substrate 100 have first overlapping regions DB1; and each first overlapping region DB1 is in a non-linear shape.

In the display panel provided by the embodiment of the present disclosure, since the orthographic projections of the effective light-emitting regions on the base substrate and the orthographic projections of the signal routing wires on the base substrate have the first overlapping regions, and each first overlapping region is in the non-linear shape, so that light emitted from the effective light-emitting regions may form light interference through the signal routing wires in the first overlapping regions. Therefore, when the display panel is applied to the 3D display device, the moire may be improved, and the display effect may be improved.

In specific implementation, in the embodiment of the present disclosure, the display panel may include a display region, and the display region may include a plurality of pixel units disposed in an array. Each pixel unit includes a plurality of sub-pixels spx. In some embodiments, a pixel unit may include a red sub-pixel, a green sub-pixel, and a blue sub-pixel. In this way, red, green and blue may be mixed to achieve color display. Or, a pixel unit may also include a red sub-pixel, a green sub-pixel, a blue sub-pixel, and a white sub-pixel. In this way, red, green, blue and white may be mixed to achieve color display. Of course, in actual applications, light-emitting colors of the sub-pixels in each pixel unit may be designed and determined according to the actual application environment, which is not limited here.

Figure 2:
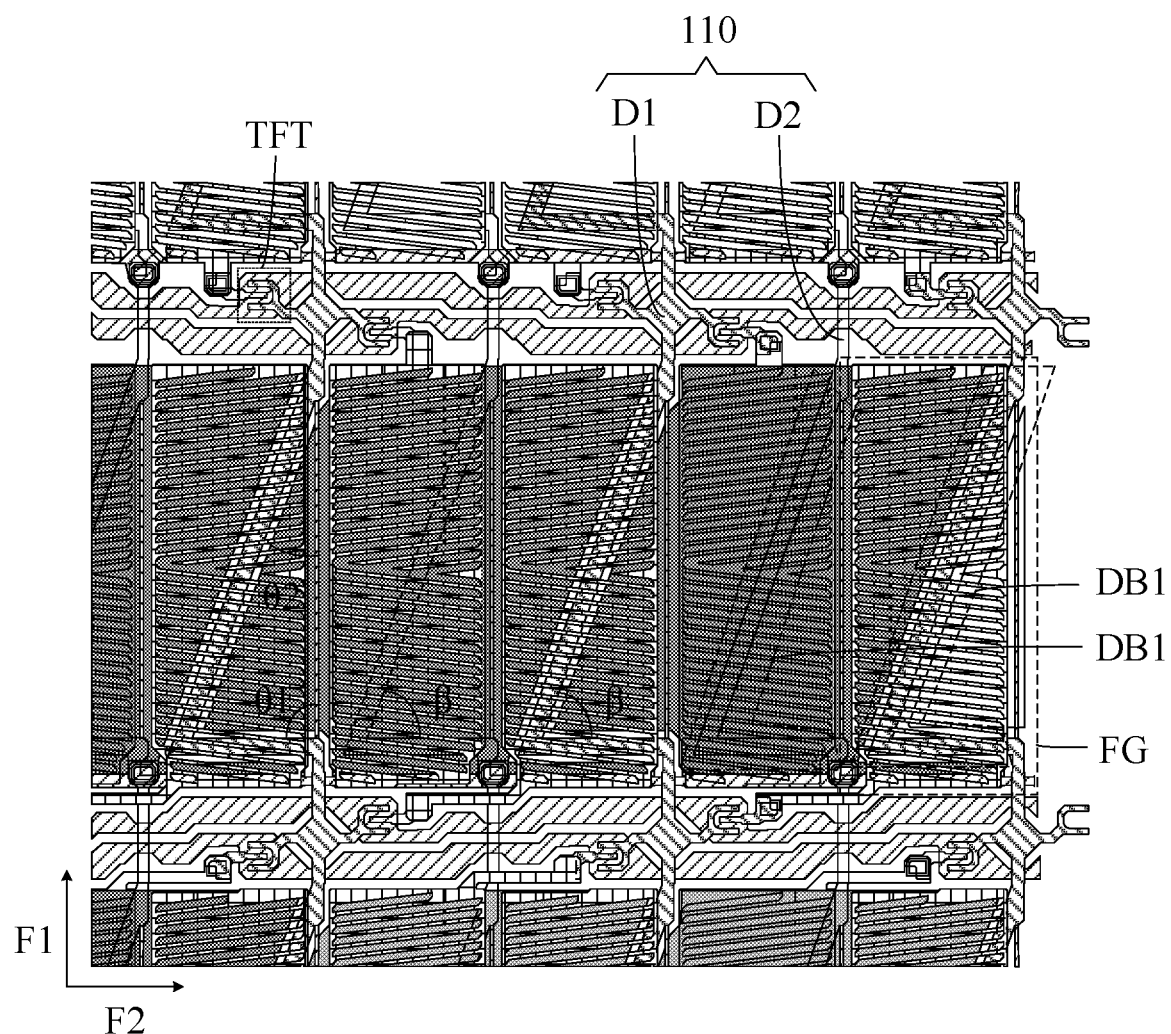
FIG. 2 is a schematic diagram of some concrete structures of a display panel in an embodiment of the present disclosure.
Figure 3A:
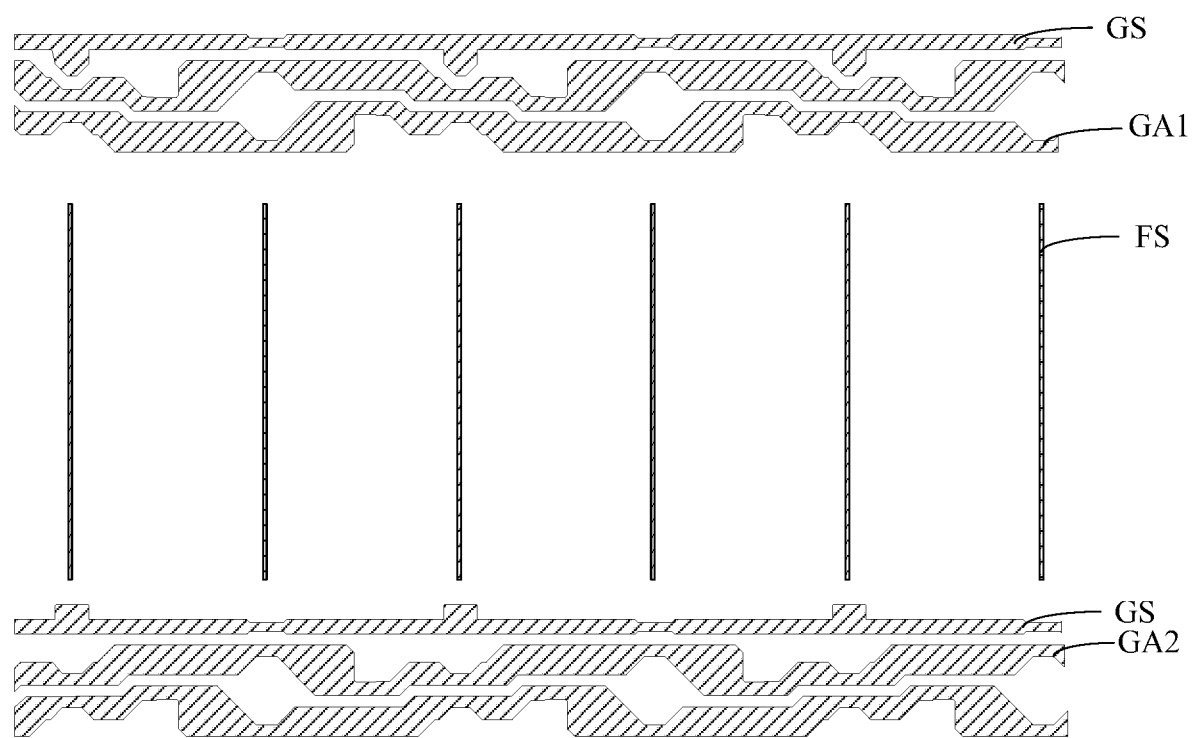
FIG. 3A is a schematic diagram of some structures of a layer where scan lines are located of a display panel in an embodiment of the present disclosure.
Figure 3B:
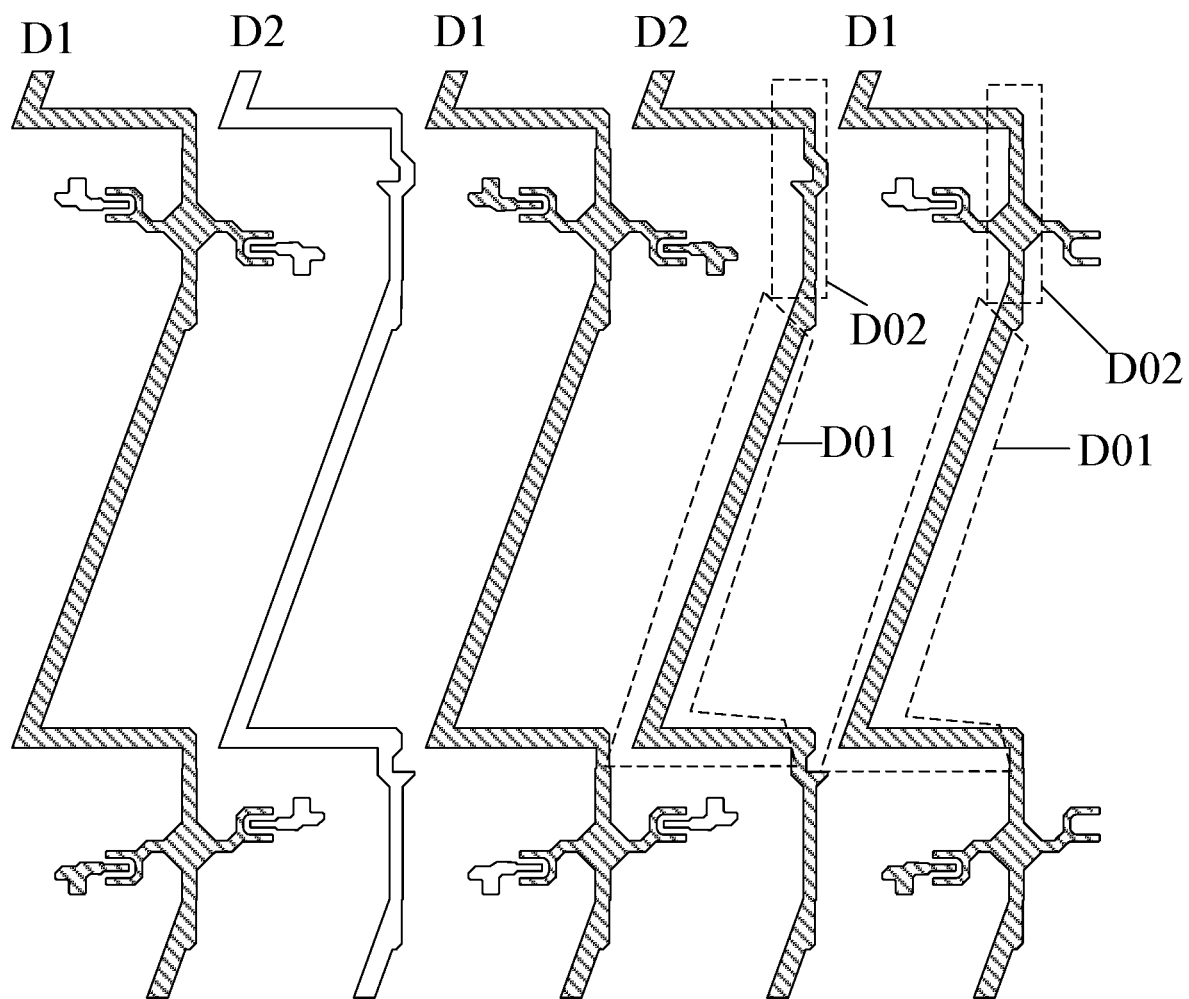
FIG. 3B is a schematic diagram of some structures of a layer where data lines are located of a display panel in an embodiment of the present disclosure.
Figure 3C:
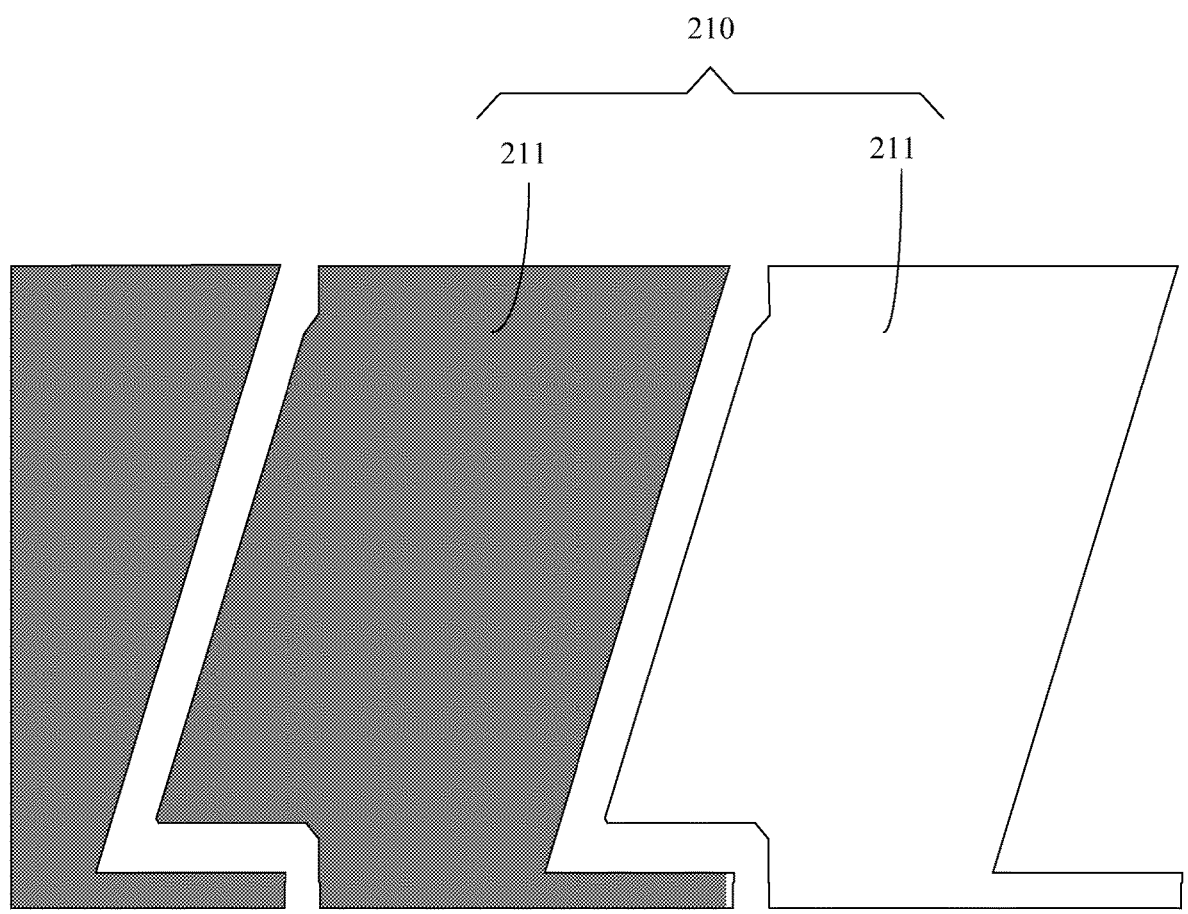
FIG. 3C is a schematic diagram of some structures of a common electrode layer of a display panel in an embodiment of the present disclosure.
Figure 3D:
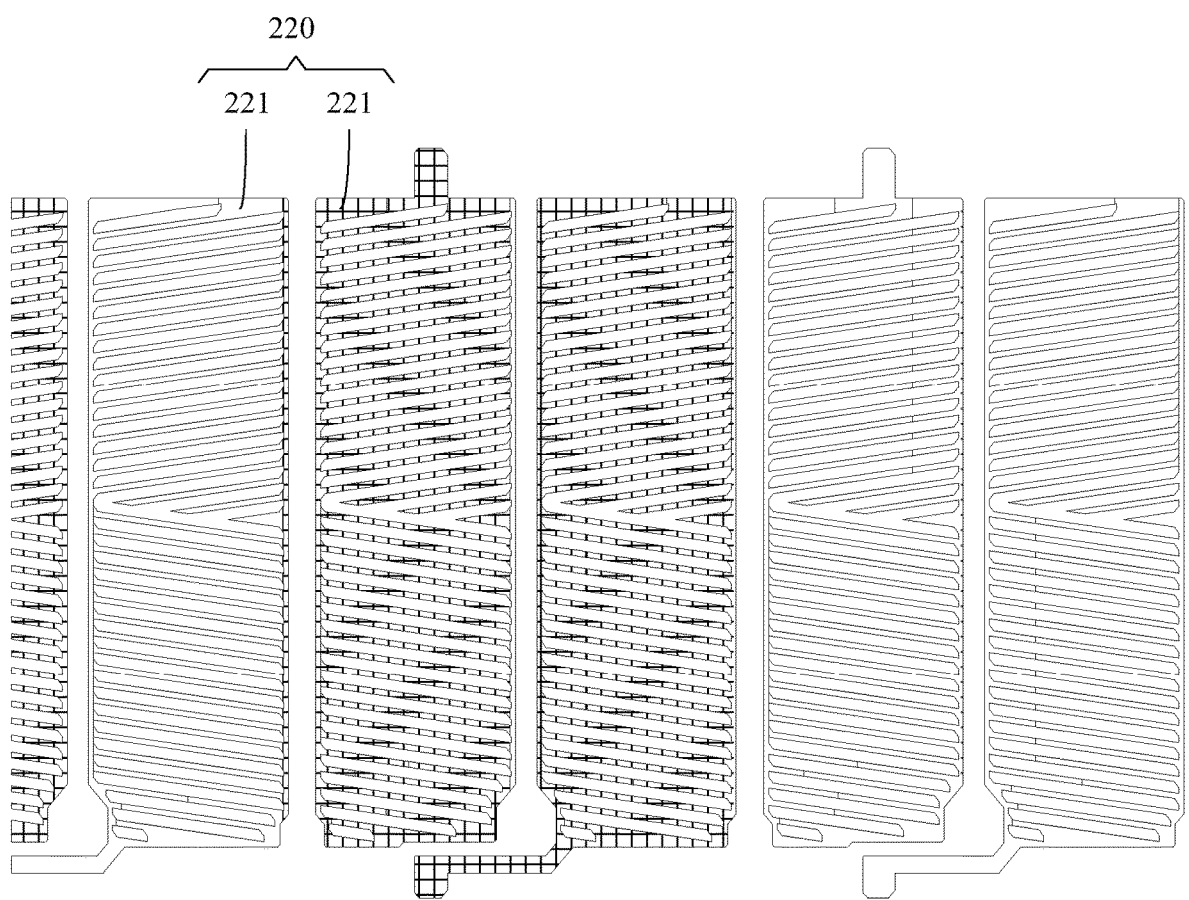
FIG. 3D is a schematic diagram of some structures of a transparent pixel electrode layer of a display panel in an embodiment of the present disclosure.
Figure 4A:
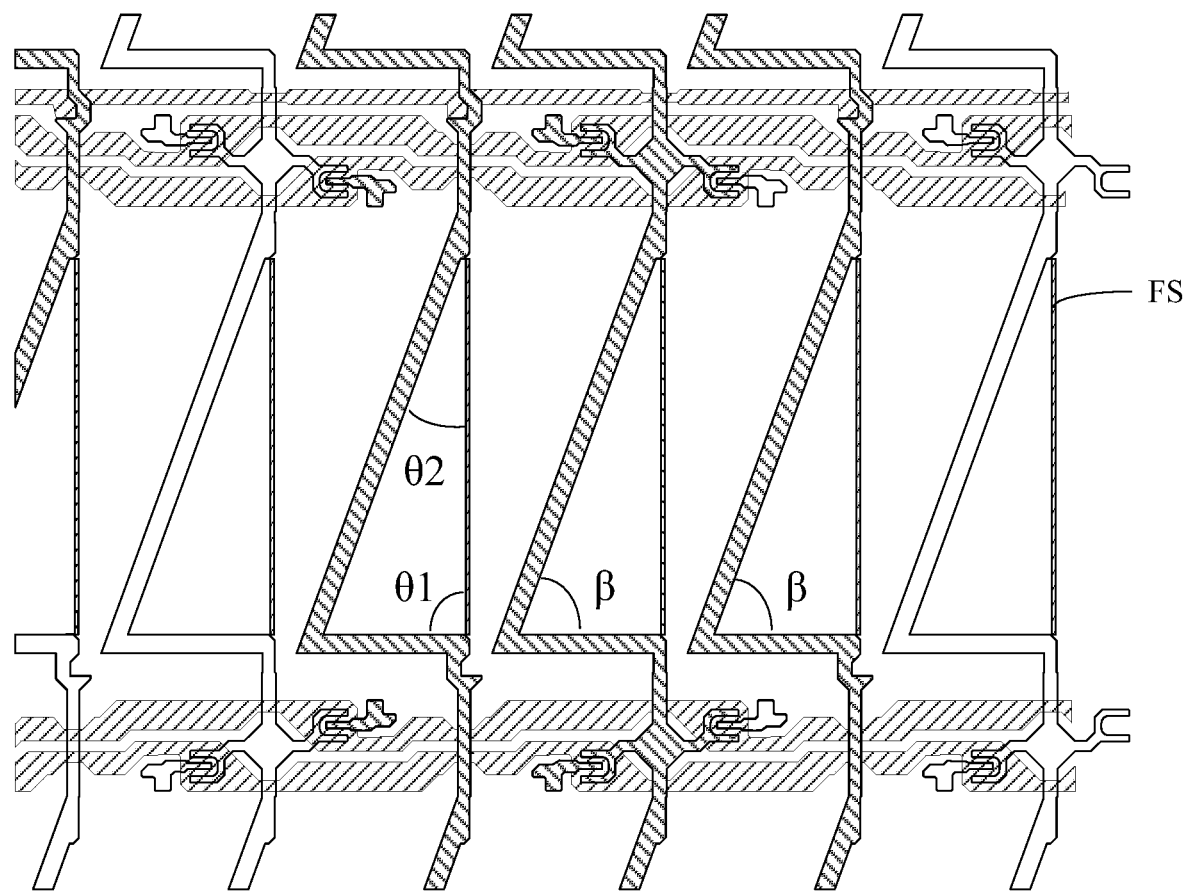
FIG. 4A is a schematic diagram of some structures of a layer where scan lines are located and a layer where data lines are located of a display panel in an embodiment of the present disclosure.
Figure 4B:
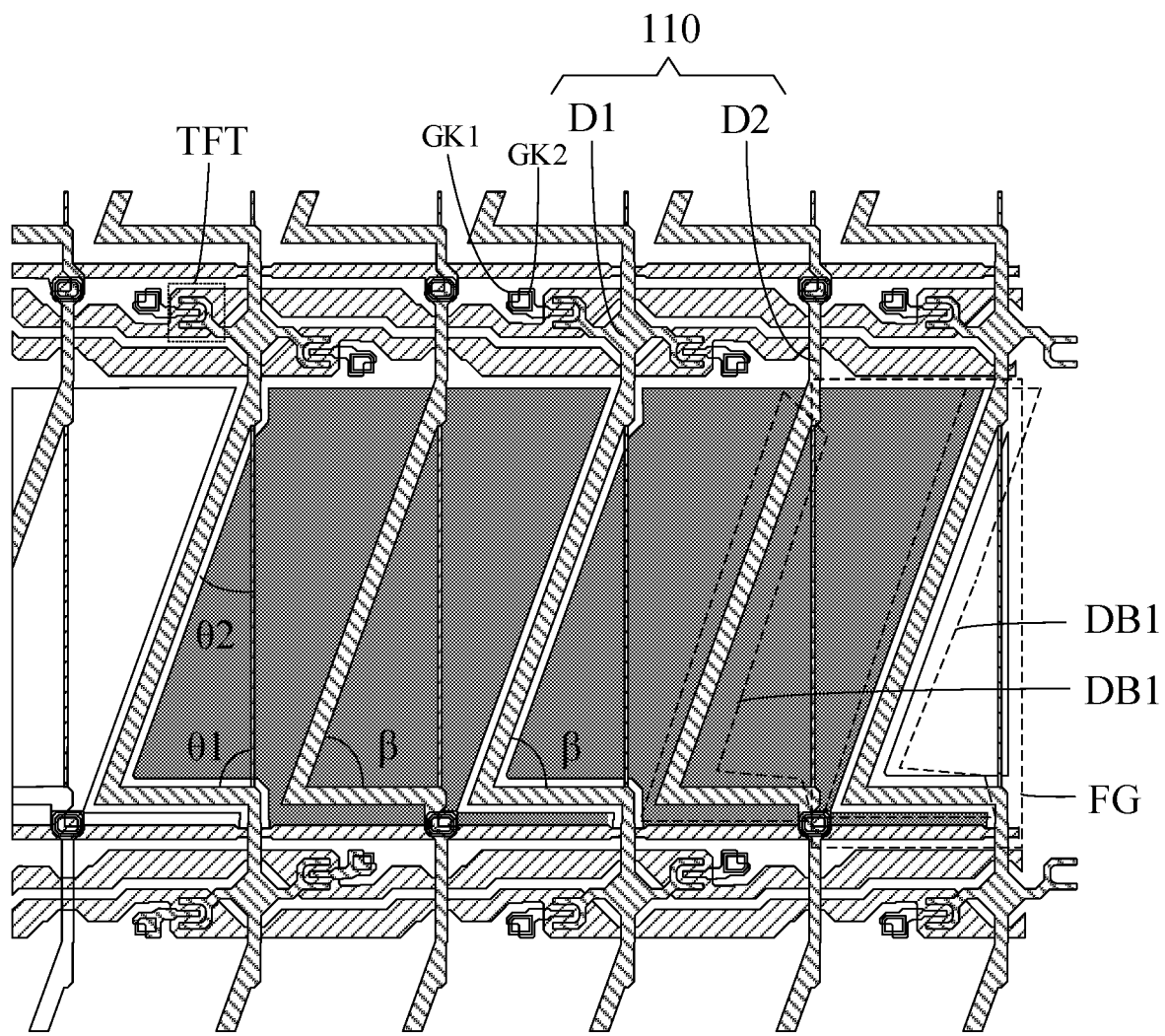
FIG. 4B is a schematic diagram of some structures of a layer where scan lines are located, a layer where data lines are located, and a common electrode layer of a display panel in an embodiment of the present disclosure.

In specific implementation, in the embodiment of the present disclosure, as shown in FIGS. 2 to 7B, each first overlapping region DB1 may be in a broken line shape, and a bending angle β of each first overlapping region DB1 may be greater than or equal to 70° and less than 180°. In some embodiments, as shown in FIG. 2, the bending angle β of each first overlapping region DB1 may be set to be 70°, an included angle θ1 between each first overlapping region DB1 in the broken line shape and a column direction F1 of a sub-pixel spx may be set to be 90°, and another included angle θ2 between each first overlapping region DB1 in the broken line shape and the column direction F1 of a sub-pixel spx may be set to be 20°. In this way, each first overlapping region DB1 and the column direction F1 may form a right triangle.

Figure 5:
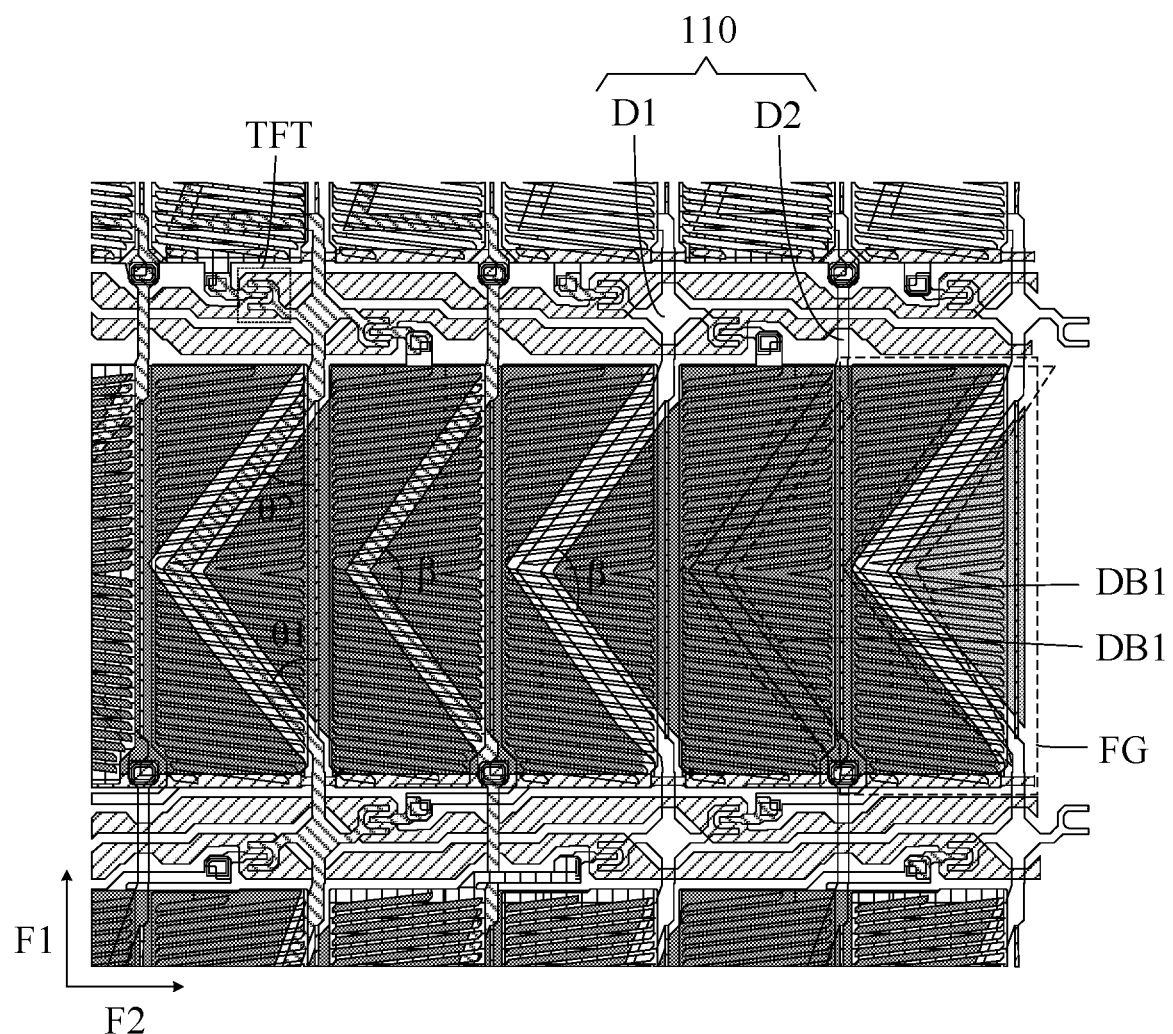
FIG. 5 is a schematic diagram of some other specific structures of a display panel in an embodiment of the present disclosure.
Figure 6A:
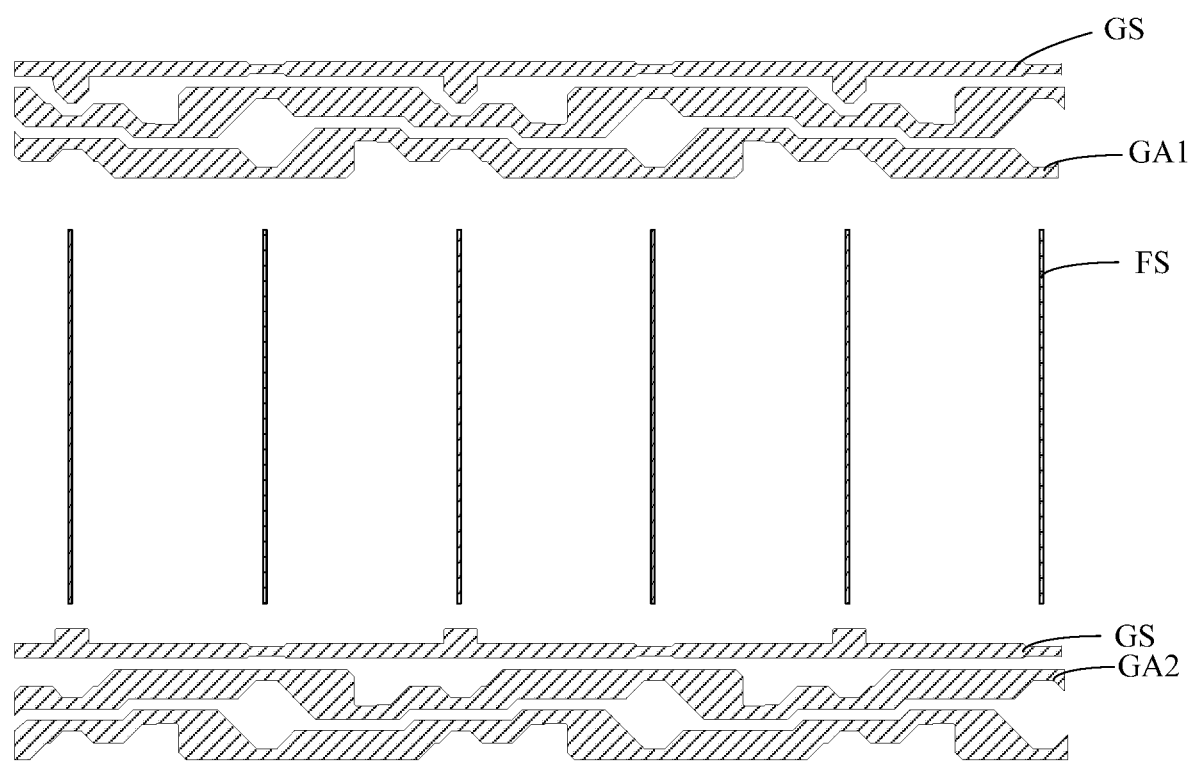
FIG. 6A is a schematic diagram of some other structures of a layer where scan lines are located of a display panel in an embodiment of the present disclosure.
Figure 6B:
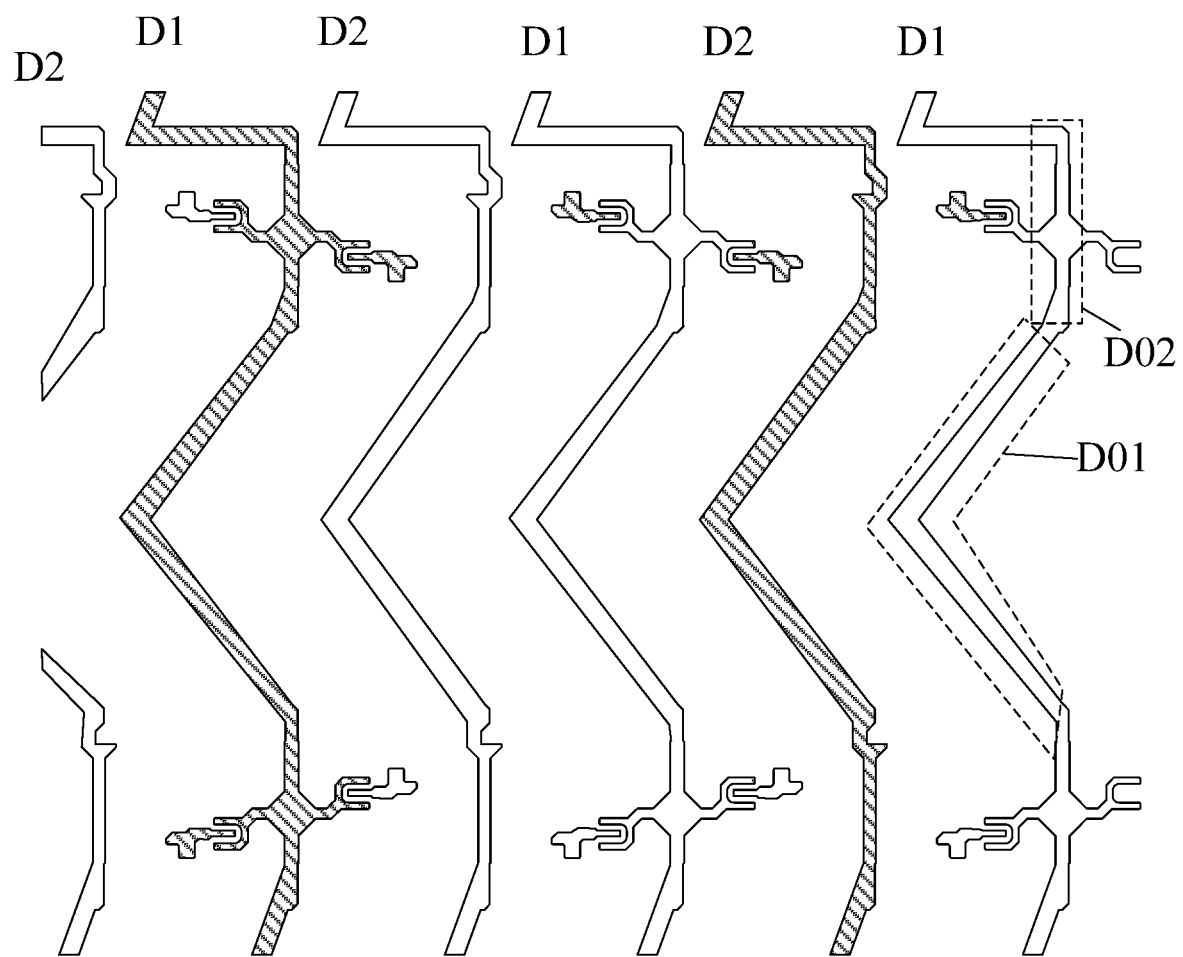
FIG. 6B is a schematic diagram of some other structures of a layer where data lines are located of a display panel in an embodiment of the present disclosure.
Figure 6C:
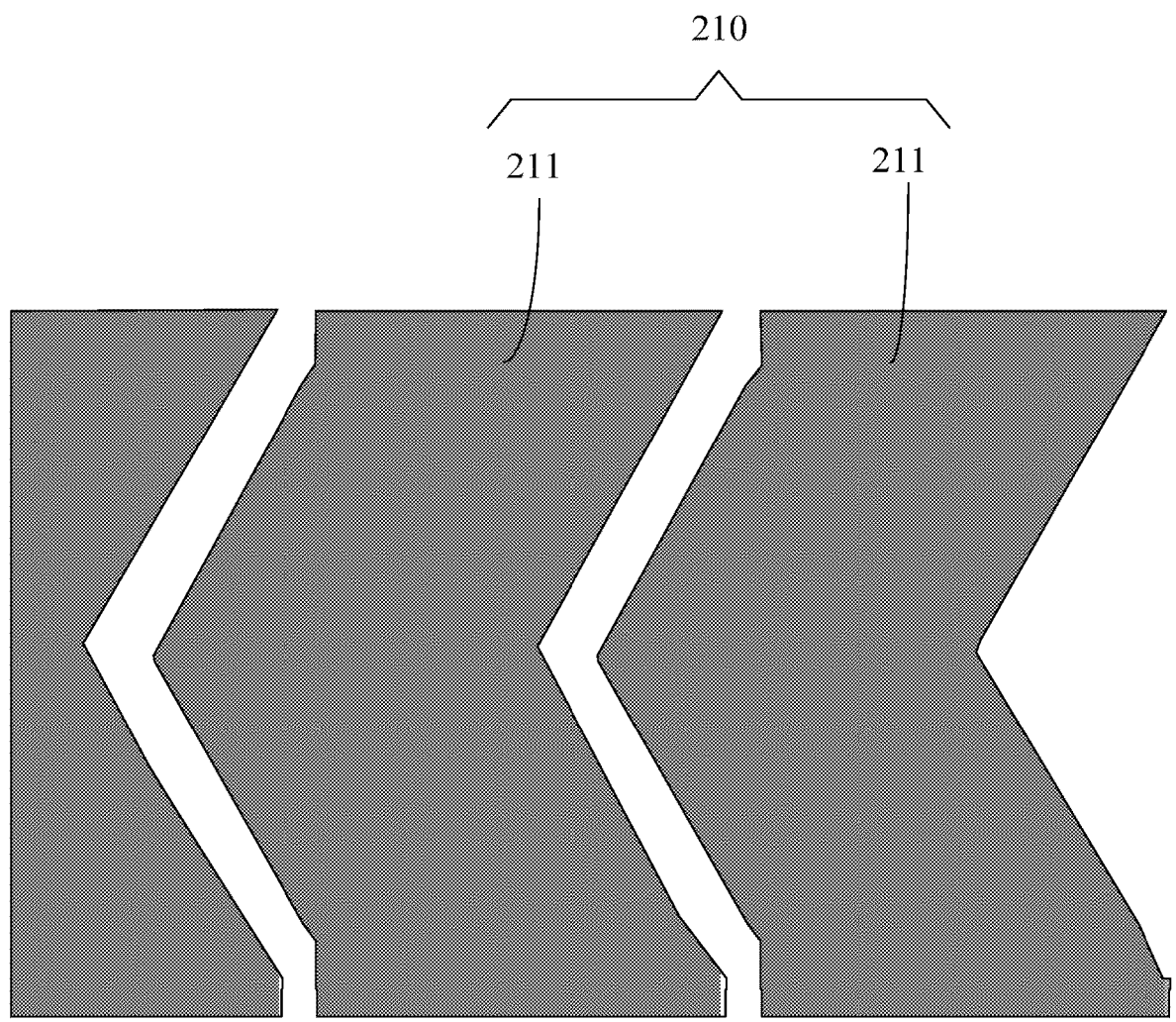
FIG. 6C is a schematic diagram of some other structures of a common electrode layer of a display panel in an embodiment of the present disclosure.
Figure 6D:
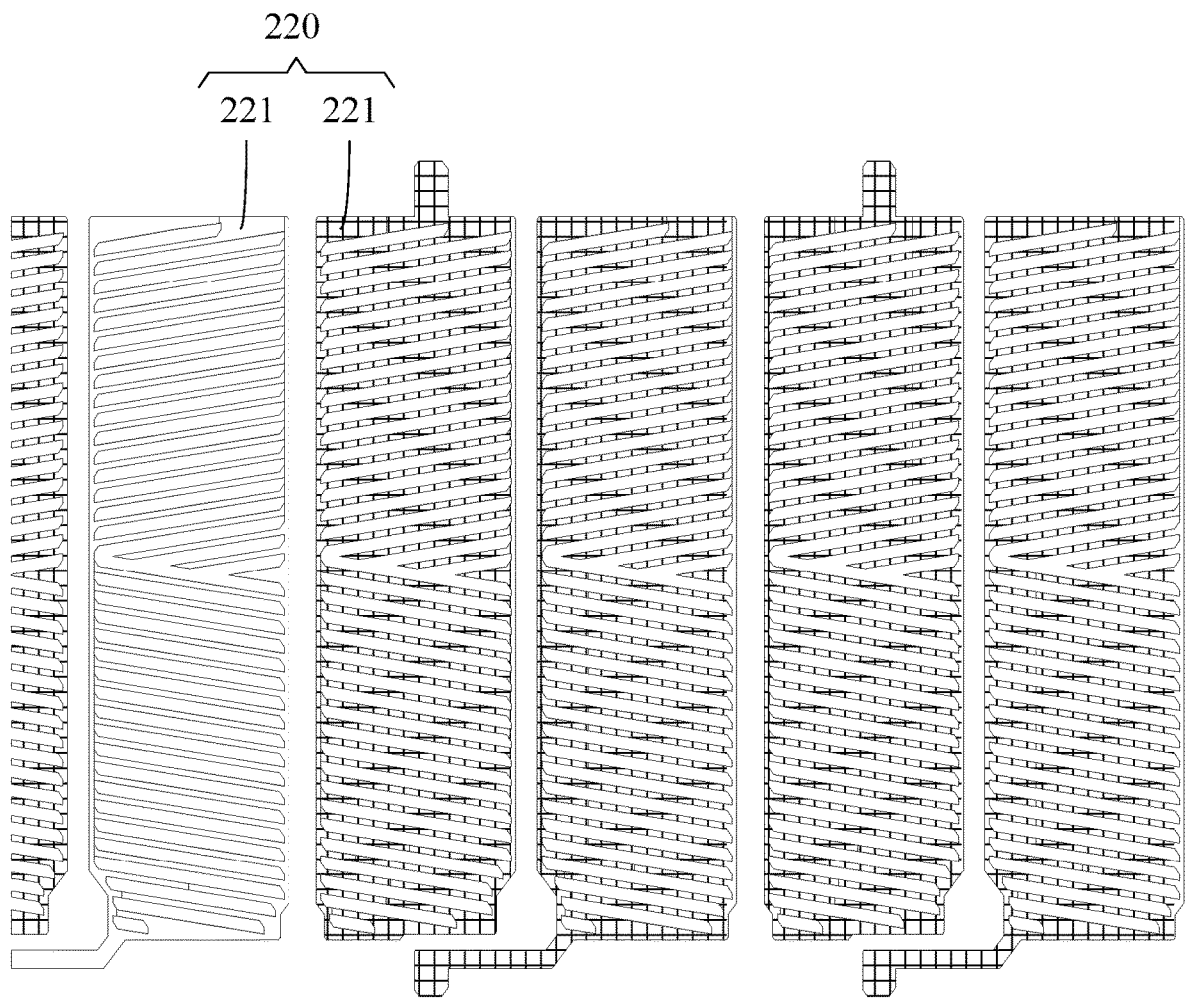
FIG. 6D is a schematic diagram of some other structures of a transparent pixel electrode layer of a display panel in an embodiment of the present disclosure.
Figure 7A:
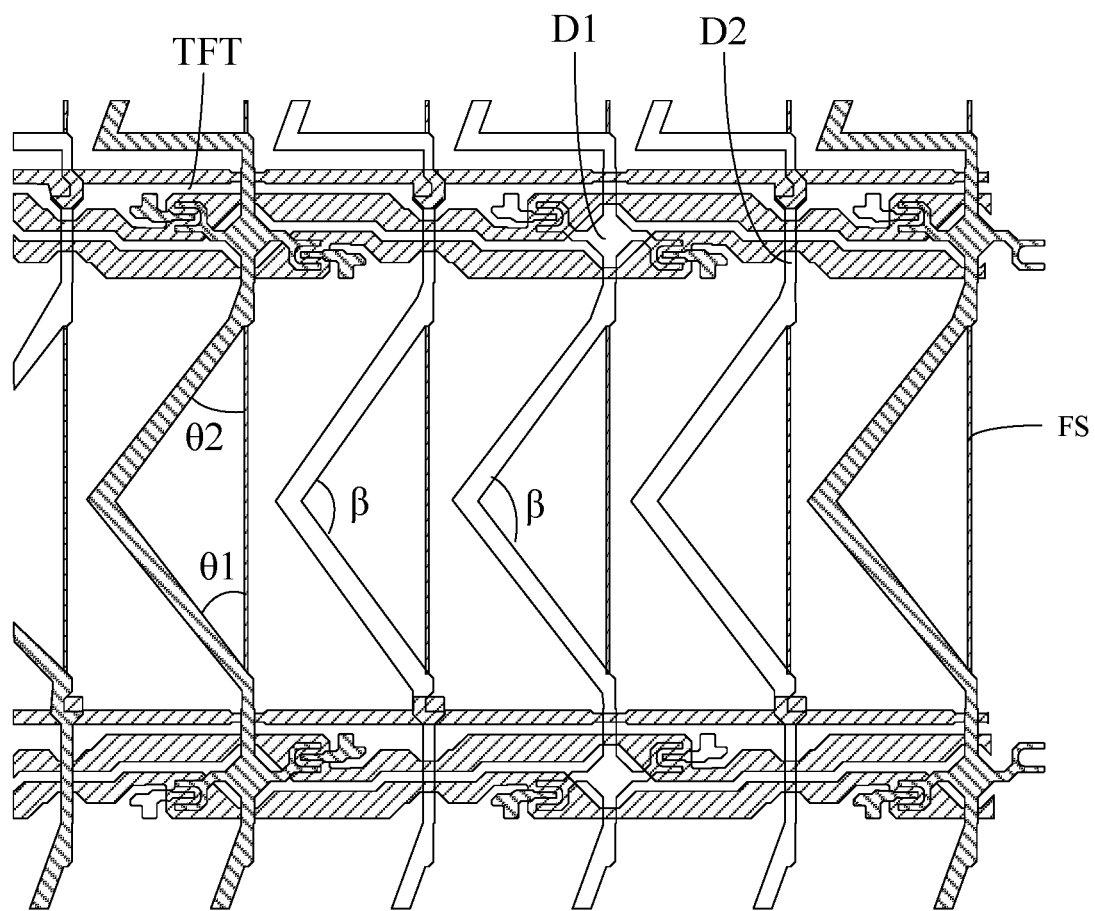
FIG. 7A is a schematic diagram of some other structures of a layer where scan lines are located and a layer where data lines are located of a display panel in an embodiment of the present disclosure.
Figure 7B:
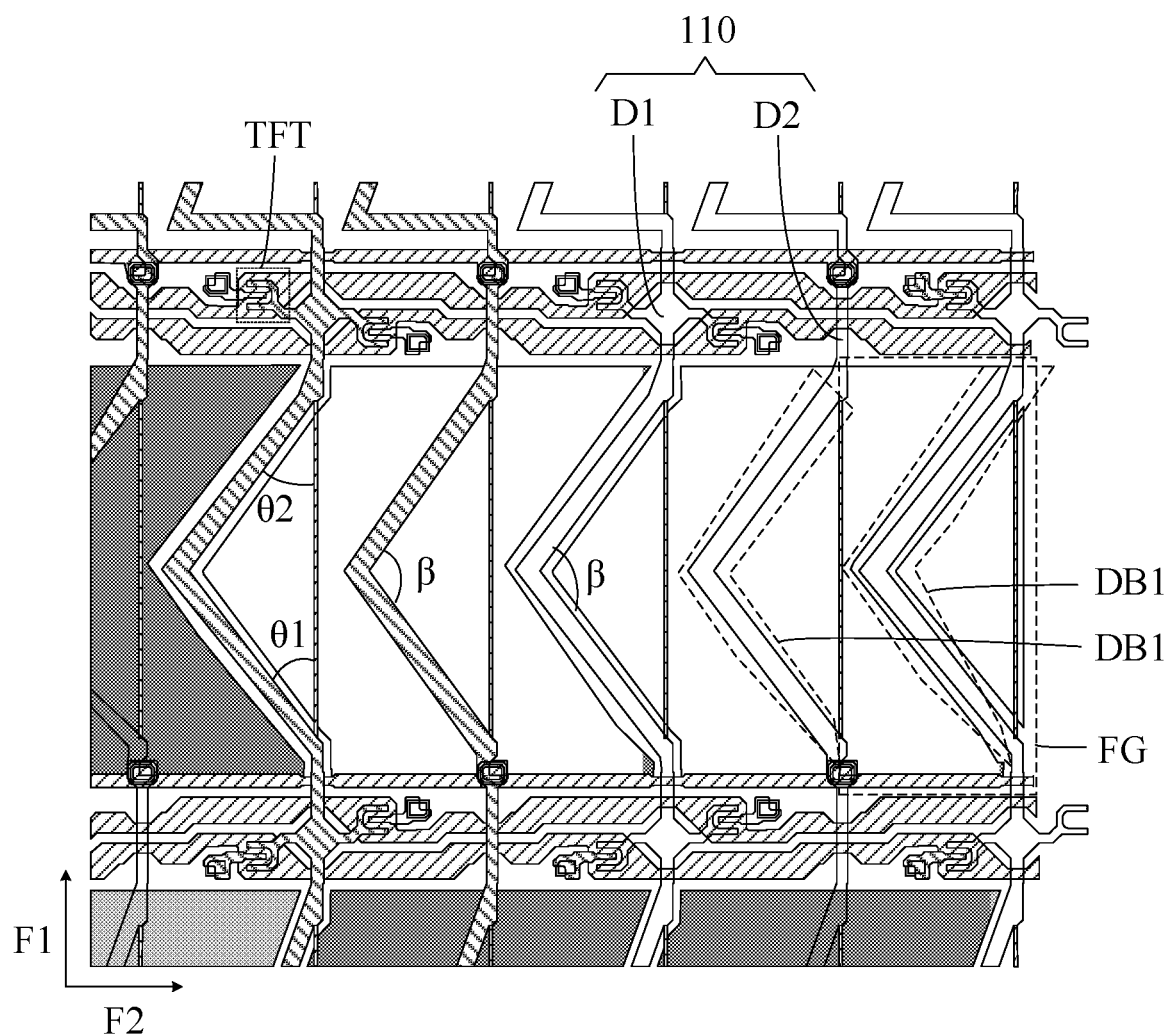
FIG. 7B is a schematic diagram of some other structures of a layer where scan lines are located, a layer where data lines are located, and a common electrode layer of a display panel in an embodiment of the present disclosure.

In some embodiments, as shown in FIG. 5, the bending angle β of each first overlapping region DB1 may be set to be an angle greater than 90° and less than 180°. For example, β may be equal to 114°. The included angle θ1 between each first overlapping region DB1 in the broken line shape and the column direction F1 of a sub-pixel spx may be set to be 22°, and another included angle θ2 between each first overlapping region DB1 in the broken line shape and the column direction F1 of a sub-pixel spx may be set to be 22°. In this way, each first overlapping region DB1 and the column direction F1 may form an isosceles triangle.

Of course, in actual applications, specific values of β, θ1, and θ2 may be designed according to actual application requirements, which are not limited here.

A liquid crystal display (LCD) panel has the features of light and thin appearance, power saving, non-radiation, etc., and is widely used. The working principle of the LCD panel is to change the disposing state of liquid crystal molecules in a liquid crystal layer by changing the voltage difference of two ends of the liquid crystal layer, so as to change the light transmittance of the liquid crystal layer to display images. In specific implementation, the display panel in the embodiment of the present disclosure may be a liquid crystal display panel. In some embodiments, the display panel may include a counter substrate disposed opposite to the base substrate 100, and a liquid crystal layer packaged between the base substrate 100 and the counter substrate. A color resist layer located in each sub-pixel spx may be disposed on the counter substrate, and a color of the color resist layer is consistent with the light-emitting color of the sub-pixel spx. In addition, each sub-pixel spx may include a pixel electrode located on the base substrate 100 and a thin film transistor (TFT) electrically connected with the pixel electrode. Of course, the base substrate 100 may also be provided with scan lines for transmitting gate scan signals and data lines for transmitting data signals. In this way, the gate scan signals are input to the thin film transistors through the scan lines to control the TFTs to be turned on, so that the data signals transmitted on the data lines are input to the pixel electrodes, a voltage are input into the pixel electrodes, and a common voltage is input to common electrodes to drive the liquid crystal molecules to rotate to display images.

In specific implementation, in the embodiment of the present disclosure, as shown in FIGS. 2 to 7B, the display panel may further include: a first insulating layer located between the data lines (for example, D1 and D2) and the base substrate 100; a plurality of auxiliary lines FS and a plurality of scan lines (for example, GA1 and GA2) which are located between the first insulating layer and the base substrate 100, where the plurality of scan lines are disposed in the same layer as the auxiliary lines FS and spaced apart from one another; a second insulating layer located on the sides, facing away from the base substrate 100, of the data lines (for example, D1 and D2); a common electrode layer 210 located on a side, facing away from the base substrate 100, of the second insulating layer; a third insulating layer located on a side, facing away from the base substrate 100, of the common electrode layer 210; and a transparent pixel electrode layer 220 located on a side, facing away from the base substrate 100, of the third insulating layer. That is, the common electrode layer 210 is located between the second insulating layer and the transparent pixel electrode layer 220, and the third insulating layer is located between the common electrode layer 210 and the transparent pixel electrode layer 220.

In specific implementation, in the embodiment of the present disclosure, as shown in FIGS. 1 to 7B, the plurality of signal routing wires 110 may include the plurality of data lines (for example, D1 and D2), and one column of sub-pixels spx corresponds to one data line. In addition, each data line includes a first sub-data line D01 and a second sub-data line D02 which are electrically connected with each other. An orthographic projection of each first sub-data line D01 on the base substrate 100 and the orthographic projection of the effective light-emitting region FG of the corresponding sub-pixel spx on the base substrate 100 form a first overlapping region DB1, and orthographic projections of second sub-data lines D02 on the base substrate 100 do not overlap the orthographic projections of the effective light-emitting regions FG on the base substrate 100. In some embodiment, the orthographic projection of each second sub-data line D02 on the base substrate 100 is located between the orthographic projections of the adjacent effective light-emitting regions FG on the base substrate 100. In this way, the data lines may be multiplexed as the signal routing wires 110 that form light interference, thereby reducing the difficulty of process preparation and reducing the thickness of the display panel.

In specific implementation, in the embodiment of the present disclosure, as shown in FIGS. 2 to 7B, the auxiliary lines FS extend in a column direction F1 of the sub-pixels spx; and one sub-pixel spx corresponds to one auxiliary line FS. The orthographic projection of each auxiliary line FS on the base substrate 100 do not overlap the orthographic projection of the effective light-emitting region FG on the base substrate 100. In addition, for the same sub-pixel spx, the orthographic projection of the auxiliary line FS on the base substrate 100 and the orthographic projection of the first sub-data line D01 on the base substrate 100 form a triangle, and the bending angle is an included angle of a side, facing the auxiliary line FS, of the first overlapping region DB1. In some embodiments, as shown in FIGS. 2 and 4A, a triangle formed by the orthographic projection of the auxiliary line FS on the base substrate 100 and the orthographic projection of the first sub-data line D01 on the base substrate 100 is a right triangle. As shown in FIGS. 5 and 7A, a triangle formed by the orthographic projection of the auxiliary line FS on the base substrate 100 and the orthographic projection of the first sub-data line D01 on the base substrate 100 is an isosceles triangle.

In specific implementation, in the embodiment of the present disclosure, as shown in FIGS. 2 to 7B, the scan lines extend in a row direction F2 of the sub-pixels spx; and one row of sub-pixels spx corresponds to two scan lines (for example, GA1 and GA2). In addition, the orthographic projections of the auxiliary lines FS corresponding to one row of sub-pixels spx on the base substrate 100 are disposed between the orthographic projections of the scan lines, corresponding to every two adjacent rows of sub-pixels spx, on the base substrate 100. In some embodiments, the orthographic projection of each scan line on the base substrate 100 is located between the orthographic projections of the effective light-emitting regions FG of every two adjacent rows of sub-pixels spx on the base substrate 100. In addition, the two scan lines corresponding to the same row of sub-pixels spx are respectively located on both sides of the corresponding row of sub-pixels spx. For example, one of the two scan lines (for example, GA1) corresponding to the same row of sub-pixels spx is electrically connected with the thin film transistors in the odd-numbered columns of sub-pixels spx in the same row, and the other scan line (for example, GA2) is electrically connected with the thin film transistors in the even-numbered columns of sub-pixels spx in the same row. The scan line (for example, GA1) electrically connected with the thin film transistors in the odd-numbered columns of sub-pixels spx in the same row may be disposed above the same row, and the scan line (for example, GA2) electrically connected with the thin film transistors in the even-numbered columns of sub-pixels spx in the same row may be disposed below the same row.

In specific implementation, in the embodiment of the present disclosure, as shown in FIGS. 1 to 7B, a plurality of data lines may include a plurality of first-type data lines D1 and a plurality of second-type data lines D2; and the first-type data lines D1 and the second-type data line D2 are alternately disposed in the row direction F2 of the sub-pixels spx. The first-type data lines D1 are electrically connected with the thin film transistors TF in the sub-pixels spx, and the second-type data lines D2 are not electrically connected with the thin film transistors TF in the sub-pixels spx. In some embodiments, the odd-numbered columns of sub-pixels spx may correspond to the first-type data lines D1, and the even-numbered columns of sub-pixels spx may correspond to the second-type data lines D2. Or, the odd-numbered columns of sub-pixels spx may correspond to the second-type data lines D2, and the even-numbered columns of sub-pixels spx may correspond to the first-type data lines D1.

In specific implementation, in the embodiment of the present disclosure, as shown in FIGS. 1 to 7B, every two adjacent columns of sub-pixels spx are taken as a column group, every two adjacent column groups correspond to one first-type data line D1, and one column group corresponds to one second-type data line. The odd-numbered rows of sub-pixels spx of a first column group in every two adjacent column groups are electrically connected with the corresponding first-type data line D1, and the even-numbered rows of sub-pixels spx of a second column group are all electrically connected with the corresponding first-type data line D1.

In some embodiments, the first column of sub-pixels spx and the second column of sub-pixels spx are a column group LZ1, the third column of sub-pixels spx and the fourth column of sub-pixels spx are a column group LZ2, and the fifth column of sub-pixels spx and the sixth column of sub-pixels spx are a column group LZ3. The column group LZ1 corresponds to a first second-type data line D2, the column group LZ2 corresponds to a second second-type data line D2, the column group LZ3 corresponds to a third second-type data line D2, the adjacent column groups LZ1 and LZ2 correspond to a first first-type data line D1, and the adjacent column groups LZ2 and LZ3 correspond to a second first-type data line D1. In the adjacent column groups LZ1 and LZ2, the column group LZ1 serves as a first column group, the column group LZ2 serves as a second column group, the odd-numbered rows of sub-pixels spx of the column group LZ1 are all electrically connected with the corresponding first-type data line D1, and the even-numbered rows of sub-pixels spx of the column group LZ2 are all electrically connected with the corresponding first-type data line D1. In the adjacent column groups LZ2 and LZ3, the column group LZ2 serves as a first column group, the column group LZ3 serves as a second column group, the odd-numbered rows of sub-pixels of the column group LZ2 are all electrically connected with the corresponding first-type data line D1, and the even-numbered rows of sub-pixels spx of the column group LZ3 are all electrically connected with the corresponding first-type data line D1. The rest is the same, and so on, which is not repeated here.

Since the first-type data lines D1 are electrically connected with the TFTs in the sub-pixels spx, and the first-type data lines D1 may transmit the data signals, in order to prevent the first-type data lines D1 and the common electrode layer 210 from interfering with each other, causing display abnormities, in the specific implementation, in the embodiment of the present disclosure, as shown in FIGS. 1 to 7B, the common electrode layer 210 may include a plurality of common electrode parts 211 spaced apart from one another. Orthographic projections of the common electrode parts 211 on the base substrate 100 may not overlap orthographic projections of the first-type data lines D1 on the base substrate 100. In this way, there is no facing area between the first-type data lines D1 and the common electrode layer 210 as far as possible, so as to prevent the first-type data lines D1 and the common electrode layer 210 from forming coupling capacitance and causing mutual signal interference.

Since the scan lines are electrically connected with the TFTs in the sub-pixels spx, and the scan lines may transmit the gate scan signals, in order to prevent the scan lines and the common electrode layer 210 from interfering with each other, causing display abnormalities, in specific implementation, in the embodiment of the present disclosure, as shown in FIGS. 1 to 7B, the orthographic projections of the common electrode parts 211 on the base substrate 100 may not overlap the orthographic projections of the scan lines on the base substrate 100. In this way, there is no facing area between the scan lines and the common electrode layer 210 as far as possible, so as to prevent the scan lines and the common electrode layer 210 from forming coupling capacitance and causing mutual signal interference.

Since the second-type data lines D2 are not electrically connected with the TFTs in the sub-pixels spx, in order to set the area of the common electrode parts 211 as large as possible, in specific implementation, in the embodiment of the present disclosure, as shown in FIGS. 1 to 7B, the orthographic projections of the common electrode parts 211 on the base substrate 100 may overlap orthographic projections of the second-type data lines D2 on the base substrate 100. Further, the orthographic projections of the common electrode parts 211 on the base substrate 100 may overlap the orthographic projections of the first sub-data lines D01 of the second-type data lines D2 on the base substrate 100.

In specific implementation, in the embodiment of the present disclosure, as shown in FIGS. 1 to 7B, one second-type data line may correspond to one column of common electrode parts 211. When the common electrode layer 210 is located between the second insulating layer and the transparent pixel electrode layer 220, the second-type data lines D2 are electrically connected with the corresponding common electrode parts 211 through second vias penetrating the second insulating layer. In this way, the common electrode parts 211 spaced apart from one another may be electrically connected through the second-type data lines D2, and a common voltage may be transmitted to the electrically connected common electrode parts 211 through the second-type data lines D2. Since the same voltage is transmitted on the second-type data lines D2 and the common electrode parts 211, signal interference between the second-type data lines D2 and the common electrode parts 211 may be avoided.

In specific implementation, in the embodiment of the present disclosure, as shown in FIGS. 1 to 7B, the display panel may further include a plurality of common electrode connection lines GS disposed in the same layer as the scan lines and spaced apart from one another. The common electrode connection lines GS extend in the row direction F2 of the sub-pixels spx, and orthographic projections of the common electrode connection lines GS on the base substrate 100 do not overlap the orthographic projections of the effective light-emitting regions FG on the base substrate 100. The common electrode connection lines GS are electrically connected with the second-type data lines D2 through first vias penetrating the first insulating layer. In this way, the common electrode connection lines GS, the second-type data lines D2, and the common electrode parts 211 may be electrically connected, and form a parallel connection effect, thereby achieving the effect of reducing resistance.

In some embodiments, one row of sub-pixels spx corresponds to one common electrode connection line GS, and each common electrode connection line GS is located between the corresponding row of sub-pixels spx and the scan line disposed below the row of sub-pixels spx. Further, one common electrode connection line GS corresponds to one row of common electrode parts 211.

In some embodiments, an orthographic projection of a second via on the base substrate 100 may be located inside an orthographic projection of a first via on the base substrate 100. Or, the orthographic projection of the first via on the base substrate 100 may be located inside the orthographic projection of the second via on the base substrate 100. Or, the orthographic projection of the second via on the base substrate 100 and the orthographic projection of the first via on the base substrate 100 may only partially overlap. Or, the orthographic projection of the second via on the base substrate 100 and the orthographic projection of the first via on the base substrate 100 may not overlap.

In specific implementation, in the embodiment of the present disclosure, as shown in FIGS. 1 to 7B, the transparent pixel electrode layer 220 includes a plurality of pixel electrodes 221 spaced apart from each other; and one sub-pixel spx includes one pixel electrode 221.

Orthographic projections of the pixel electrodes 221 on the base substrate 100 and an orthographic projection of the common electrode layer 210 on the base substrate 100 have overlapping regions. In some embodiments, each pixel electrode 221 has a hollowed-out region, and orthographic projections of the hollowed-out regions of the pixel electrodes 221 on the base substrate 100 and the orthographic projection of the common electrode layer 210 on the base substrate 100 have overlapping regions. In this way, an electric field may be formed through the pixel electrodes and the common electrode layer 210 to drive the liquid crystal molecules to deflect.

It should be noted that a gate insulating layer may be disposed between a layer where the scan lines are located and the base substrate, and an active layer of the TFTs may be disposed between the gate insulating layer and the base substrate.

Figure 8:
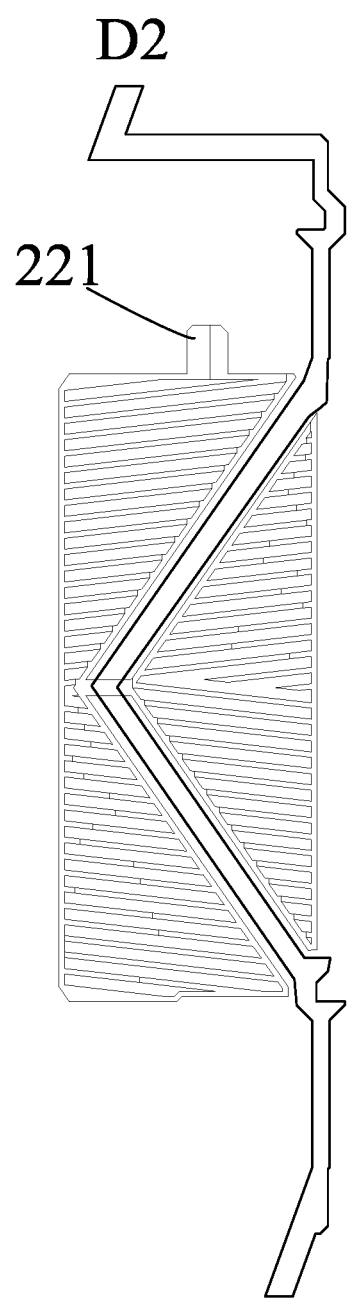
FIG. 8 is a schematic diagram of some structures of a transparent pixel electrode layer and a layer where data lines are located of a display panel in an embodiment of the present disclosure.
Figure 9:
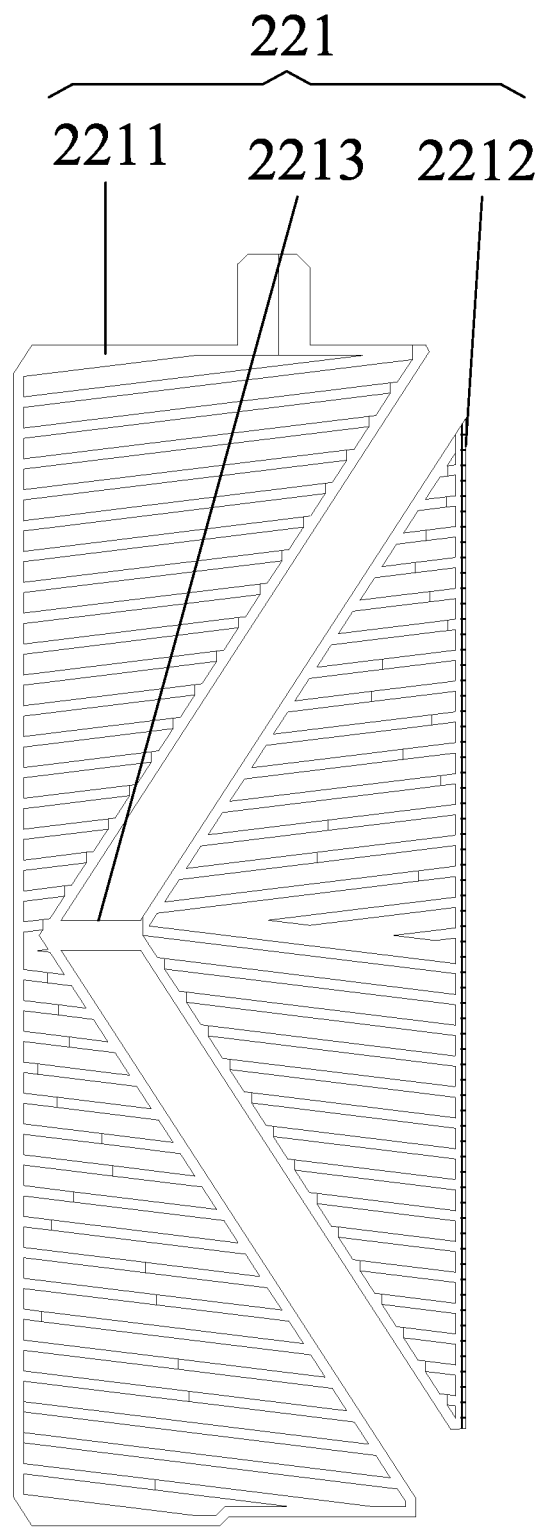
FIG. 9 is a schematic diagram of some other structures of a transparent pixel electrode layer of a display panel in an embodiment of the present disclosure.

An embodiment of the present disclosure provides some other display panels, the schematic structural diagrams of which are shown in FIGS. 8 and 9, which are modified from the implementation in the above-mentioned embodiment. The following only describes the differences between this embodiment and the above-mentioned embodiment, and the similarities are not repeated here.

In specific implementation, in the embodiment of the present disclosure, the common electrode layer 210 is located between a layer where the auxiliary lines FS are located and the base substrate 100, and a third insulating layer is located between the common electrode layer 210 and the layer where the auxiliary lines FS are located. That is, the display panel may include: the first insulating layer located between the data lines and the base substrate 100; the plurality of auxiliary lines FS and the plurality of scan lines which are located between the first insulating layer and the base substrate 100, where the plurality of scan lines are located on the same layer as the auxiliary lines FS and spaced apart from one another; the common electrode layer 210 between the layer where the auxiliary lines FS are located and the base substrate 100; the third insulating layer located between the common electrode layer 210 and the layer where the auxiliary lines FS are located; the second insulating layer located on the sides, facing away from the base substrate 100, of the data lines; and the transparent pixel electrode layer 220 located on the side, facing away from the base substrate 100, of the second insulating layer.

In specific implementation, in the embodiment of the present disclosure, when the common electrode layer 210 is located between the layer where the auxiliary lines FS are located and the base substrate 100, the second-type data lines D2 are electrically connected with the corresponding common electrode parts 211 through third vias penetrating the first insulating layer and the third insulating layer.

In specific implementation, in the embodiment of the present disclosure, each third via may include a third transfer hole and a third conducting hole. The third transfer holes penetrate the first insulating layer, and the third conducting holes penetrate the third insulating layer. The second-type data lines D2 are electrically connected with the common electrode connection lines GS through the third transfer holes, and the common electrode connection lines GS are electrically connected with the common electrode parts 211 through the third conducting holes.

In some embodiments, an orthographic projection of a third transfer hole on the base substrate 100 may be located inside an orthographic projection of the third conducting hole on the base substrate 100. Or, the orthographic projection of the third conducting hole on the base substrate 100 may be located inside the orthographic projection of the third transfer hole on the base substrate 100. Or, the orthographic projection of the third transfer hole on the base substrate 100 and the orthographic projection of the third conducting hole on the base substrate 100 may only partially overlap. Or, the orthographic projection of the third transfer hole on the base substrate 100 and the orthographic projection of the third conducting hole on the base substrate 100 may not overlap.

Since only one second insulating layer is disposed between the layer where the data lines are located and the transparent pixel electrode layer 220, the data lines may cause signal interference to the pixel electrodes in the transparent pixel electrode layer 220. In order to reduce the signal interference, in specific implementation, in the embodiment of the present disclosure, as shown in FIGS. 8 and 9, each pixel electrode 221 may include: a first sub-pixel electrode 2211, a second sub-pixel electrode 2212, and an electrode connection part 2213; and the first sub-pixel electrode 2211 and the second sub-pixel electrode 2212 are spaced apart from each other. The first sub-pixel electrode 2211 and the second sub-pixel electrode 2212 in the same pixel electrode 221 are electrically connected through the electrode connection part 2213. The orthographic projections of the data lines (for example, D1 and D2, and FIG. 8 takes D1 as an example) on the base substrate 100 do not overlap orthographic projections of the first sub-pixel electrodes 2211 and the second sub-pixel electrodes 2212 on the base substrate 100. In this way, the facing area between the data lines and the pixel electrodes is reduced as much as possible to reduce the coupling capacitance, thereby reducing the signal interference and improving the display effect.

It should be noted that a first gate insulating layer may be disposed between the common electrode layer and the layer where the scan lines are located, the active layer of the thin film transistors may be disposed between the first gate insulating layer and the layer where the scan lines are located, and a second gate insulating layer may be disposed between the active layer of the thin film transistors and the layer where the scan lines are located.

Based on the same inventive concept, an embodiment of the present disclosure further provides a display device, including the above display panel provided by the embodiment of the present disclosure. The principle of solving the problem of the display device is similar to that of the display panel. Therefore, the implementation of the display device may refer to the implementation of the display panel, which will not be repeated here.

In specific implementation, in the embodiment of the present disclosure, the display device may further include: a grating located on a light emitting side of the display panel. The grating is used to enable the display device to achieve the 3D display effect, so that the display device in the embodiment of the present disclosure may achieve the 3D display effect.

According to the display panel and the display device provided by the embodiments of the present disclosure, since the orthographic projections of the effective light-emitting regions on the base substrate and the orthographic projections of the signal routing wires on the base substrate have the first overlapping regions, and each first overlapping region is in the non-linear shape, light emitted from the effective light-emitting regions can form light interference through the signal routing wires in the first overlapping regions. Therefore, when the display panel is applied to a 3D display device, the moire can be improved, and the display effect can be improved.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:
1. A display panel, comprising:
a base substrate; and
a plurality of sub-pixels and a plurality of signal routing wires on the base substrate;
wherein each of the plurality of sub-pixels comprises an effective light-emitting region;
an orthographic projection of the effective light-emitting region on the base substrate and an orthographic projection of one of the plurality of signal routing wires on the base substrate have a first overlapping region; and the first overlapping region is in a non-linear shape;
wherein the plurality of signal routing wires comprise a plurality of data lines;
one column of sub-pixels corresponds to one of the plurality of data lines;
each of the plurality of data lines comprises a plurality of first sub-data lines and a plurality of second sub-data lines alternately and electrically connected with each other;
an orthographic projection of each first sub-data line on the base substrate and the orthographic projection of the effective light-emitting region of a corresponding sub-pixel on the base substrate form the first overlapping region; and
orthographic projections of second sub-data lines on the base substrate do not overlap orthographic projections of effective light-emitting regions on the base substrate;
wherein each first sub-data line is multiplexed as the signal routing wire that forms light interference;

wherein for a same data line, every two adjacent second sub-data lines of the same data line is only electrically connected through a first sub-data line of the same data line;

wherein the display panel further comprises: a first insulating layer between the plurality of data lines and the base substrate, and a plurality of auxiliary lines between the first insulating layer and the base substrate;

wherein an orthographic projection of any one of the plurality of auxiliary lines on the base substrate is located between orthographic projections of two adjacent first sub-data lines in a row direction of the plurality of sub-pixels on the base substrate.

2. The display panel according to claim 1, wherein the first overlapping region is in a broken line shape, and a bending angle of the first overlapping region is greater than or equal to 70° and less than 180°.

3. The display panel according to claim 2,
wherein the plurality of auxiliary lines extend in a column direction of the plurality of sub-pixels;
one of the plurality of sub-pixels corresponds to one of the plurality of auxiliary line;
orthographic projections of the plurality of auxiliary lines on the base substrate do not overlap the orthographic projections of the effective light-emitting regions on the base substrate; and
for a same sub-pixel, an orthographic projection of an auxiliary line on the base substrate and an orthographic projection of the first sub-data line on the base substrate form a triangle, and the bending angle is an included angle of a side, facing the auxiliary line, of the first overlapping region.

4. The display panel according to claim 3, further comprising:
a second insulating layer arranged on a side, facing away from the base substrate, of the plurality of data lines, and
a transparent pixel electrode layer arranged on a side, facing away from the base substrate, of the second insulating layer;
wherein the transparent pixel electrode layer comprises a plurality of pixel electrodes spaced apart from one another, and
the one sub-pixel comprises one pixel electrode.

5. The display panel according to claim 4, wherein each pixel electrode comprises: a first sub-pixel electrode, a second sub-pixel electrode, and an electrode connection part;
the first sub-pixel electrode and the second sub-pixel electrode are spaced apart from each other;
the first sub-pixel electrode and the second sub-pixel electrode in a same pixel electrode are electrically connected through the electrode connection part; and
orthographic projections of the plurality of data lines on the base substrate do not overlap orthographic projections of first sub-pixel electrodes and second sub-pixel electrodes on the base substrate.

6. The display panel according to claim 4, further comprising: a common electrode layer and a third insulating layer;
wherein the common electrode layer is arranged between the second insulating layer and the transparent pixel electrode layer, and the third insulating layer is arranged between the common electrode layer and the transparent pixel electrode layer; or
the common electrode layer is arranged between a layer where the plurality of auxiliary lines are arranged and the base substrate, and the third insulating layer is arranged between the common electrode layer and the layer where the plurality of auxiliary lines are arranged.

7. The display panel according to claim 1, wherein the plurality of data lines comprise a plurality of first-type data lines and a plurality of second-type data lines;
the plurality of first-type data lines and the plurality of second-type data lines are alternately disposed in the row direction of the plurality of sub-pixels;
every two adjacent columns of sub-pixels serve as a column group, and every two adjacent column groups correspond to one of the plurality of first-type data lines;
wherein odd-numbered rows of sub-pixels of a first column group in the every two adjacent column groups are all electrically connected with a corresponding first-type data line; and
even-numbered rows of sub-pixels in a second column group in the every two adjacent column groups are all electrically connected with a corresponding first-type data line.

8. The display panel according to claim 7, wherein a common electrode layer comprises a plurality of common electrode parts spaced apart from one another;
orthographic projections of the common electrode parts on the base substrate do not overlap orthographic projections of the plurality of first-type data lines on the base substrate; and/or
the orthographic projections of the common electrode parts on the base substrate do not overlap orthographic projections of scan lines on the base substrate; and/or
the orthographic projections of the common electrode parts on the base substrate overlap orthographic projections of the plurality of second-type data lines on the base substrate.

9. The display panel according to claim 8, wherein one column group corresponds to one of the plurality of second-type data lines, and the one second-type data line corresponds to one column of common electrode parts; and
when the common electrode layer is arranged between the second insulating layer and the transparent pixel electrode layer, the plurality of second-type data lines are electrically connected with corresponding common electrode parts through second vias penetrating the second insulating layer.

10. The display panel according to claim 9, further comprising: common electrode connection lines disposed in a same layer as the scan lines and spaced apart from one another;
wherein the common electrode connection lines extend in the row direction of the plurality of sub-pixels;
orthographic projections of the common electrode connection lines on the base substrate do not overlap the orthographic projections of the effective light-emitting regions on the base substrate; and
the common electrode connection lines are electrically connected with the plurality of second-type data lines through first vias penetrating the first insulating layer.

11. The display panel according to claim 8, wherein one column group corresponds to one of the plurality of second-type data line, and the one second-type data line corresponds to one column of common electrode parts; and
when the common electrode layer is arranged between a layer where auxiliary lines are arranged and the base substrate, the plurality of second-type data lines are electrically connected with corresponding common electrode parts through third vias penetrating a first insulating layer and a third insulating layer.

12. The display panel according to claim 11, further comprising: common electrode connection lines disposed in a same layer as the scan lines and spaced apart from one another;
- wherein the common electrode connection lines extend in the row direction of the plurality of sub-pixels;
- orthographic projections of the common electrode connection lines on the base substrate do not overlap the orthographic projections of the effective light-emitting regions on the base substrate;
- the third vias comprise third transfer holes and third conducting holes, wherein the third transfer holes penetrate the first insulating layer, and the third conducting holes penetrate the third insulating layer; and
- the plurality of second-type data lines are electrically connected with the common electrode connection lines through the third transfer holes, and the common electrode connection lines are electrically connected with the plurality of common electrode parts through the third conducting holes.

13. A display device, comprising the display panel according to claim 1.

14. The display device according to claim 13, further comprising: a grating arranged on a light emitting side of the display panel.

* * * * *